United States Patent
Tanokura et al.

(10) Patent No.: US 6,899,544 B2
(45) Date of Patent: May 31, 2005

(54) INTEGRATED CIRCUIT DEVICE AND WIRING BOARD

(75) Inventors: Masaru Tanokura, Kanagawa (JP); Yukio Yanagita, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/853,493

(22) Filed: May 26, 2004

(65) Prior Publication Data

US 2004/0242027 A1 Dec. 2, 2004

(30) Foreign Application Priority Data

May 28, 2003 (JP) ........................................ 2003-151556

(51) Int. Cl.[7] .............................................. H01R 9/09
(52) U.S. Cl. ........................................ 439/60; 361/777
(58) Field of Search .............................. 439/60, 66, 67, 439/77, 495, 591; 361/777, 764, 760, 718, 748; 174/260, 261; 257/713

(56) References Cited

U.S. PATENT DOCUMENTS

| | | | | |
|---|---|---|---|---|
| 5,946,195 A | * | 8/1999 | Hashimoto | ................... 361/774 |
| 5,969,461 A | * | 10/1999 | Anderson et al. | ........ 310/313 R |
| 6,002,592 A | * | 12/1999 | Nakamura et al. | ........... 361/760 |
| 6,566,601 B2 | * | 5/2003 | Maetani | ...................... 174/52.4 |
| 6,753,595 B1 | * | 6/2004 | Lin et al. | .................... 257/668 |
| 6,831,234 B1 | * | 12/2004 | Asai et al. | ................... 174/261 |

FOREIGN PATENT DOCUMENTS

JP   2002-196036   7/2002

* cited by examiner

*Primary Examiner*—Gary Paumen
*Assistant Examiner*—Phuongchi Nguyen
(74) *Attorney, Agent, or Firm*—McGinn & Gibb, PLLC (57) ABSTRACT

A semiconductor device has a plurality of first pads to a plurality of fourth pads laid out in a first direction, thereby forming first to fourth pad rows. The first to fourth pad rows are laid out in the named order in a second direction orthogonal to the first direction. First to fourth leads are respectively connected between the first to fourth pad rows and a semiconductor chip. A first slanted side inclined to the first direction is formed at each second pad at that corner which lies on that side of the third pad row. A second slanted side inclined to the second direction in such a way as to face the first slanted side is formed at each third pad. Each first lead has a first slanted portion provided between the first slanted side and the second slanted side and extending in a direction oblique to the first direction.

18 Claims, 7 Drawing Sheets

FIG. 2

INTEGRATED CIRCUIT DEVICE AND WIRING BOARD

BACKGROUND OF THE INVENTION

1. Field of the Invention

The present invention relates to an integrated circuit device which has an integrated circuit and a plurality of pads for receiving and outputting signals to the integrated circuit, and a wiring board of the integrated circuit device. More particularly, the present invention relates to an integrated circuit device, such as a tape carrier package, a semiconductor chip or an electronic device, and a wiring board, such as a tape carrier or a printed wiring board.

2. Description of the Related Art

Signal input and output between a probe card and a semiconductor integrated circuit are carried out through pads. For example, signal input and output between a semiconductor chip mounted on a TCP (Taper Carrier Package), such as a TAB (Tape Automated Bonding) or COF (Chip On Film), and a probe card are carried out through pads provided on the base film of the TCP. Signal input and output between an integrated circuit, formed on a semiconductor chip, and a probe card are executed through pads provided on the semiconductor substrate.

The optimization of the layout of pads is important in ensuring easier contact of probes provided on the probe card with the pads. For example, Japanese Patent Laid-Open Publication No. 2002-196036 discloses a technique of laying out a plurality of pads in a direction inclined to the lengthwise direction of the semiconductor substrate which is mounted on the TCP in order to ensure easier contact of probes to pads on the TCP.

The prior art technique however has the following drawbacks. Recently, the number of signals to be input to and output from a semiconductor integrated circuit is increasing. Accordingly, the number of pads needed for signal input and output between a probe card and a semiconductor integrated circuit is increasing too. According to the technique described in Japanese Patent Laid-Open Publication No. 2002-196036, an increase in the number of pads enlarges the area of a region where pads are laid out in proportion to the number of pads.

However, an increase in the area of the pad-layout region in proportion to the number of pads undesirably leads to an increase in the cost for an integrated circuit device. For example, an increase in the area needed for layout of pads on a TCP increases the manufacture cost for the TCP. Likewise, an increase in the area needed for layout of pads on a semiconductor chip increases the manufacture cost for the semiconductor chip. Therefore, there is a demand of reducing the area needed for layout of pads.

SUMMARY OF THE INVENTION

It is an object of the present invention to provide an integrated circuit device having a smaller layout region for pads for signal input to and output from a probe card, and a wiring board thereof.

The present invention is described hereunder using reference symbols which will be used in the later descriptions of embodiments of the invention. Those reference symbols are added to clarify the correlation between the recitations in the appended claims and the descriptions of the embodiments. It is to be noted however that the added reference symbols should not be used to interpret the technical scope of the subject matters recited in the appended claims.

An integrated circuit device comprises: a substrate (21, 27, 15); a first pad row having a plurality of first pads (3) provided in a first direction (x direction) on the substrate; a second pad row having a plurality of second pads (4) provided in the first direction (x direction) on the substrate; a third pad row having a plurality of third pads (5) provided in the first direction (x direction) on the substrate, the first to third pad rows being apart from each other in a second direction (y direction) orthogonal to the first direction (x direction), the second pad row being sandwiched by the first and third pad rows; a plurality of first leads (7) provided on the substrate and respectively connected to the plurality of first pads; a plurality of second leads (8) provided on the substrate and respectively connected to the plurality of second pads; a plurality of third leads (9) provided on the substrate and respectively connected to the plurality of third pads; and an integrated circuit (1, 14, 16) provided at that position on the substrate at which the integrated circuit and the second pad row sandwich the third pad row, and connected to the first leads, the second leads and the third leads.

And, a first slanted side (4a) extending in a direction oblique to the first direction is formed at each of the second pads (4) at that corner which lies on that side of the third pad row, a second slanted side (5a) extending in a direction oblique to the second direction is formed at each of the third pads (5) at that corner which faces the first slanted side (4a), and each of the first leads (7) has a first slanted portion (7a) provided between the first slanted side (4a) and the second slanted side (5a) and extending in a direction oblique to the first direction.

According to the invention, the corners of the second pad (4) and the third pad (5) are cut off and the first slanted portion (7a) of the first lead (7) is put through the cut-off corners. This can reduce the distance between the centers of the third pads (5) and the offset from the center of the second pad (4) to the center of the third pad (5) in the second direction (y direction) while ensuring the required clearance between the second pad (4) and the first lead (7) and the required clearance between the third pad (5) and the first lead (7). Therefore, the semiconductor device can effectively reduce the area needed for the layout of the first pads (3), the second pads (4) and the third pads (5).

It is preferable that the direction in which the first slanted side (4a) extends, the direction in which the second slanted side (5a) extends and the direction in which the first slanted portion (7a) extends should be parallel to one another.

It is also preferable that the plurality of first pads (3) should be laid out at equidistances, the plurality of second pads (4) should be laid out at equidistances, the plurality of third pads (5) should be laid out at equidistances, a layout pitch (D) of the first pads (3), a layout pitch (D) of the second pads (4) and a layout pitch (D) of the third pads (5) should be equal to one another, an offset (Lx) in the first direction (x direction) from a center (13) of the first pad (3) to a center (14) of the second pad (4) should be equal to an offset (Lx)

in the first direction (x direction) from a center (14) of the second pad (4) to a center (15) of the third pad (5), and an offset (Ly) in the second direction (y direction) from a center (13) of the first pad (3) to a center (14) of the second pad (4) should be equal to an offset (Ly) in the second direction (y direction) from a center (14) of the second pad (4) to a center (15) of the third pad (5).

This does not conflict the layout of the first pads (3), the second pads (4) and the third pads (5). The layout of the individual pads can provide uniform contact pressure to make the probes of the probe card contact the first pad (3), the second pads (4) and the third pads (5).

Further, the number of pad rows of the integrated circuit device should be at least three, and is not limited to three.

The integrated circuit device may further have a fourth pad row having a plurality of fourth pads (6) provided in the first direction (x direction) on the substrate, the third pad row being sandwiched by the second and fourth pad rows; and a plurality of fourth leads (10) provided on the substrate and respectively connected between the plurality of fourth pads and the integrated circuit. A third slanted side (5b) inclined to the first direction (x direction) may be formed at each of the third pads (5) at a diagonal portion to the second slanted side (5a), a fourth slanted side (6a) inclined to the first direction may be formed at each of the fourth pads (6) at that corner which faces the third slanted side (5b), each of the first leads (7) may have a second slanted portion (7b) provided between the third slanted side (5b) and the fourth slanted side (6a) and extending in a direction inclined to the first direction, and each of the second leads (8) may have a third slanted portion (8a) provided between the third slanted side (5b) and the fourth slanted side (6a) and extending in a direction inclined to the first direction.

In this case, it is preferable that the direction in which the third slanted side (5b) extends, the direction in which the fourth slanted side (6a) extends, the direction in which the second slanted portion (7b) extends and the direction in which the third slanted portion (8a) extends should be parallel to one another. This can make the area of the region needed for the layout of the first pad (3), the second pads (4), the third pads (5) and the fourth pads (6) smaller.

The substrate may be a base film of a tape carrier for TCP, such as a COP or TAB, the integrated circuit may be a semiconductor chip mounted on the tape carrier, and the integrated circuit device may be a tape carrier package.

Alternatively, the substrate may be a semiconductor substrate of a semiconductor chip, the integrated circuit may be an integrated circuit formed at a surface of the semiconductor substrate, and the integrated circuit device may be a semiconductor chip.

The substrate may be an insulating substrate of a printed wiring board, the integrated circuit may be an electronic circuit provided on insulating substrate, and the integrated circuit device may be an electronic device.

A wiring board according to the present invention comprises: a substrate (21, 27, 15); a first pad row having a plurality of first pads (3) provided in a first direction on the substrate; a second pad row having a plurality of second pads (4) provided in the first direction on the substrate; a third pad row having a plurality of third pads (5) provided in the first direction on the substrate, the first to third pad rows being apart from each other in a second direction orthogonal to the first direction, and the second pad row being sandwiched by the first and third pad rows; a plurality of first leads (7) provided on the substrate and respectively connected to the plurality of first pads; a plurality of second leads (8) provided on the substrate and respectively connected to the plurality of second pads; and a plurality of third leads (9) provided on the substrate and respectively connected to the plurality of third pads.

A first slanted side (4a) extending in a direction oblique to the first direction is formed at each of the second pads (4) at that corner which lies on that side of the third pad row, a second slanted side (5a) extending in a direction oblique to the second direction is formed at each of the third pads (5) at that corner which faces the first slanted side (5a), and each of the first leads (7) has a first slanted portion (7a) provided between the first slanted side (4a) and the second slanted side (5a) and extending in a direction oblique to the first direction.

The present invention can reduce the area of the region where pads to be used for signal input and output to and from an integrated circuit are laid out, and can achieve downsizing and cost reduction of an integrated circuit device.

DETAILED DESCRIPTION OF THE PREFERRED EMBODIMENTS

Figure 1:
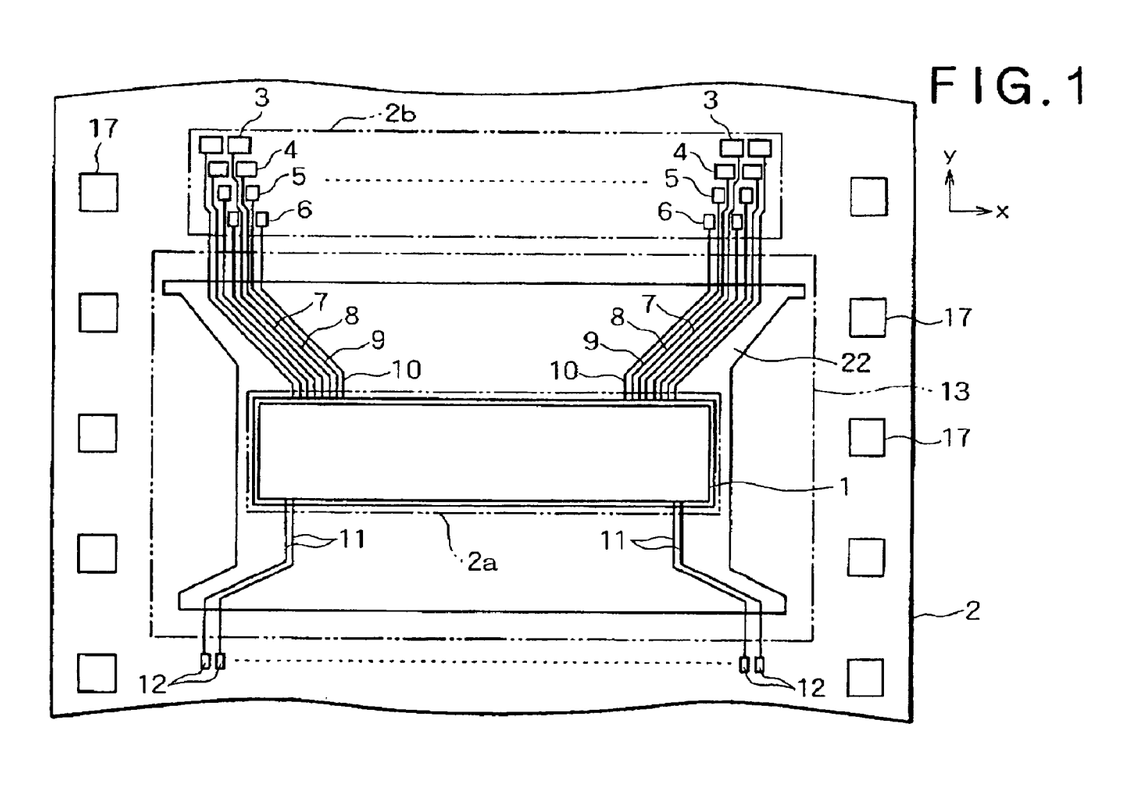
FIG. 1 is a plan view showing an integrated circuit device according to a first embodiment of the invention.
Figure 2:
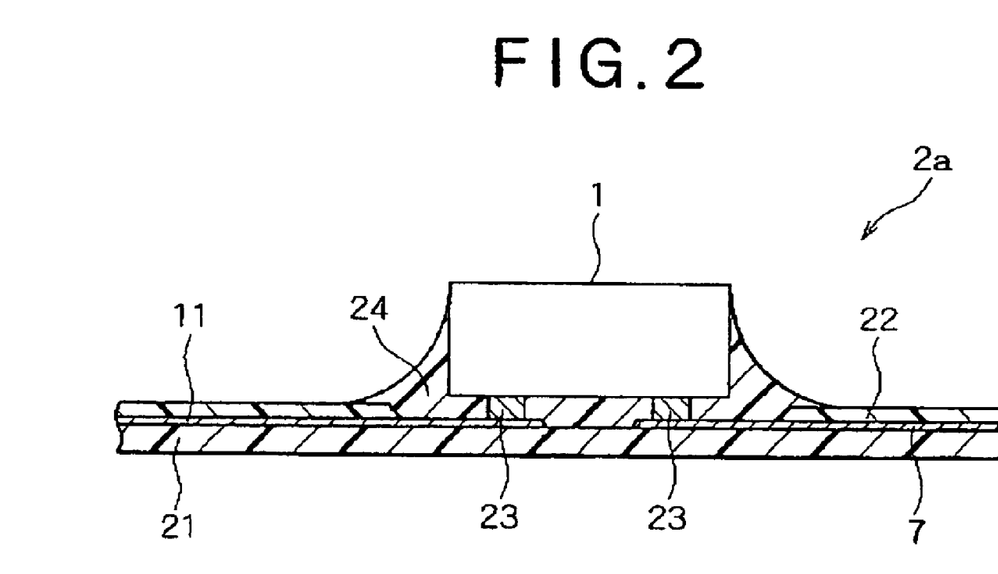
FIG. 2 is a cross-sectional view of the integrated circuit device.
Figure 3:
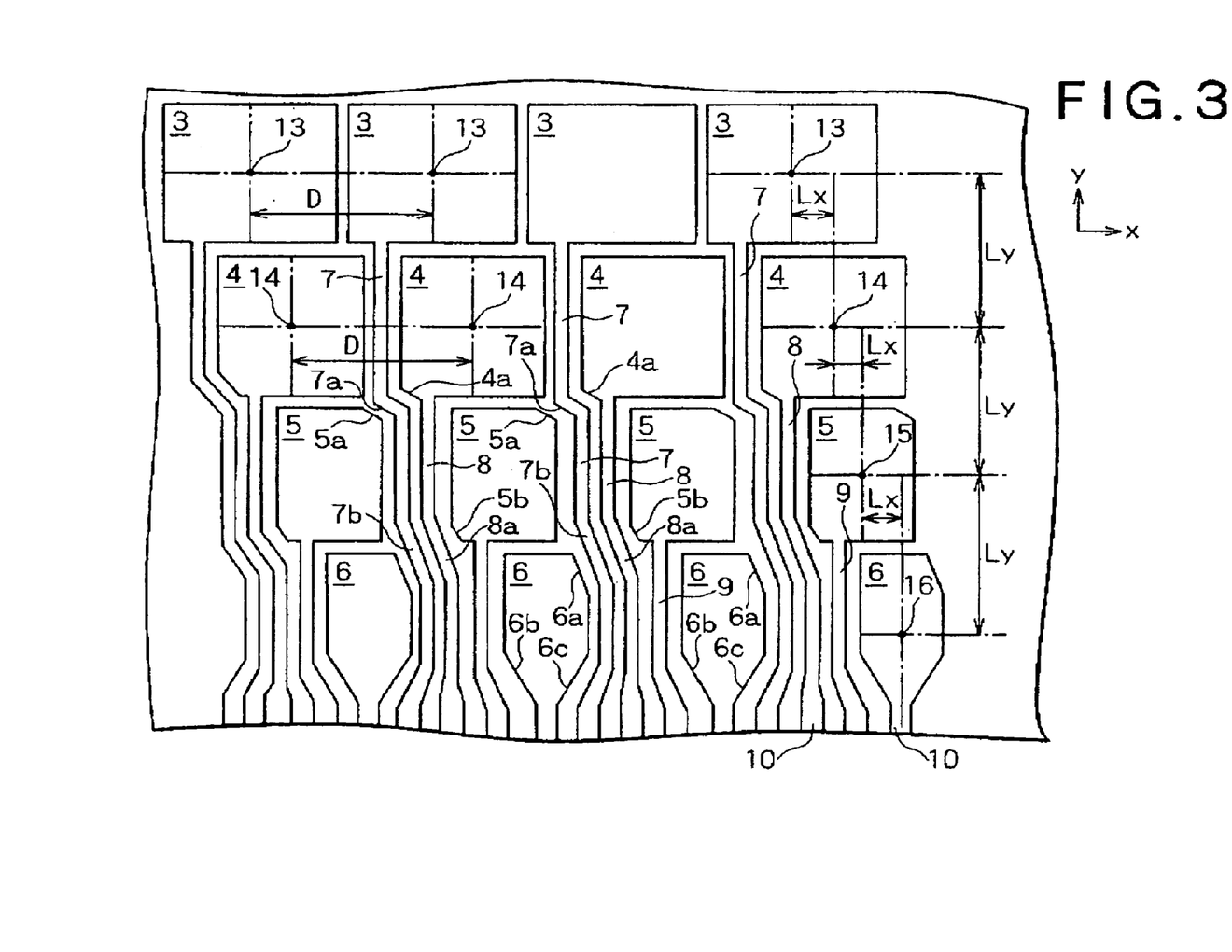
FIG. 3 is a partly-enlarged plan view showing the pad layout region of the integrated circuit device shown in FIG. 1.

Preferred embodiments of the present invention are described below with reference to the accompanying drawings. To begin with, the first embodiment of the invention is discussed. FIG. 1 is a plan view showing an integrated circuit device according to the embodiment, FIG. 2 is a cross-sectional view of the integrated circuit device, and FIG. 3 is a partly-enlarged plan view showing the pad layout region of the integrated circuit device shown in FIG. 1.

As shown in FIG. 1, the integrated circuit device according to the embodiment is a COF package (tape carrier package). The COF package is provided with a belt-like tape carrier 2. The x direction and y direction shown in FIGS. 1 and 3 are the widthwise direction and the lengthwise direction of the tape carrier 2, respectively. The tape carrier 2 has chip mount regions 2a and pad layout regions 2b alternately laid out in the y direction (lengthwise direction). That is, the structure shown in FIG. 1 is repeated in the y direction.

A semiconductor chip 1 is mounted on the chip mount region 2a of the tape carrier 2. The semiconductor chip 1 is provided with a semiconductor substrate at the surface of which an integrated circuit is formed.

Pads 3, pads 4, pads 5 and pads 6 are formed at the pad layout region 2b of the tape carrier 2. The pads 3 are laid out in a row at equidistances in the x direction. Likewise, the pads 4 to 6 are laid out in rows at equidistances in the x direction. The row of the pads 3 is located farthest from the semiconductor chip 1, the row of the pads 4 is located second farthest from the semiconductor chip 1, the row of the pads 5 is located third farthest from the semiconductor chip 1, and the row of the pads 6 is closest to the semiconductor chip 1. In other words, the row of the pads 3, the row of the pads 4, the row of the pads 5 and the row of the pads 6 are laid out in the named order in the y direction toward the chip mount region 2a.

Further, leads 7 to 10 are provided at the pad layout region 2b and the region between the pad layout region 2b and the chip mount region 2a. The pads 3 to 6 are equal in number to the leads 7 to 10, respectively. Each lead 7 is connected between each pad 3 and the semiconductor chip 1, each lead 8 is connected between each pad 4 and the semiconductor chip 1, each lead 9 is connected between each pad 5 and the semiconductor chip 1, and each lead 10 is connected between each pad 6 and the semiconductor chip 1.

A plurality of pads 12 are provided at a region opposite to the pad layout region 2b as seen from the chip mount region 2a on the tape carrier 2. The pads 12 are laid out in a row in the x direction. Leads 11 equal in quantity to the pads 12 are provided on the tape carrier 2. Each pad 12 is electrically connected to the integrated circuit of the semiconductor chip 1 via the associated lead 11.

A rectangular cut line 13 is set on the tape carrier 2 in such a way as to encircle the chip mount region 2a. When this COF package is assembled into a final product, e.g., a liquid crystal display, the tape carrier 2 is cut along the cut line 13 and the portion within the cut line 13 is assembled into the final product. The cut line 13 indicates an expected position at which the tape carrier 2 is to be cut after inspection of the semiconductor chip 1, and is not a real constituting element.

As shown in FIG. 2, the tape carrier 2 is provided with a base film 21. The leads 7 to 11 are formed on the base film 21. The pads 3 to 6 and pads 12 are likewise formed on the base film 21, though not illustrated in FIG. 2. A solder resist 22 is provided around the chip mount region 2a on the base film 21. Some of those portions of the leads 7 to 11 which are positioned between the chip mount region 2a and the pad layout region 2b are covered with the solder resist 22, while those portions which are positioned inside the chip mount region 2a are not covered with the solder resist 22 and are exposed. The semiconductor chip 1 is connected to the exposed portions of the leads 7 to 11 via bumps 23. The junctions between the semiconductor chip 1 and the leads 7 to 11 are sealed and protected with a seal resin 24. The seal resin 24 is not shown in FIG. 1. A plurality of feed holes 17 are formed in a row at both side portions of the base film 21 along the y direction.

Referring to FIG. 3, the shapes and layouts of the pads 3 to 6 and the leads 7 to 10 are elaborated. For easier understanding, the +x direction, −x direction, +y direction and −y direction defined in the plain of the tape carrier 2 are sometimes expressed as "rightward", "leftward", "upward" and "downward", respectively. It is to be noted that those directions should not necessarily match with the directions in the real space.

To make the contact pressure of the probes of the probe card on the pads 3 to 6 as uniform as possible, the pads 3 to 6 are laid out in such a way as to meet the following conditions.

First, the pads 3 to 6 are laid out in such a way that the pitches (distances) of centers 13 to 16 of the pads 3 to 6 are the same in the x direction. That is, the centers 13 of the pads 3 are laid out at a distance D in the x direction, the centers 14 of the pads 4 are laid out at the distance D in the x direction, the centers 15 of the pads 5 are laid out at the distance D in the x direction, and the centers 16 of the pads 6 are laid out at the distance D in the x direction.

Secondly, the pads 3 to 6 are laid out in such a way that the offset from the center 13 of the pad 3 to the center 14 of the pad 4 in the x direction, the offset from the center 14 of the pad 4 to the center 15 of the pad 5 in the x direction, the offset from the center 15 of the pad 5 to the center 16 of the pad 6 in the x direction, and the offset from the center 16 of the pad 6 to the center 13 of the pad 3 in the x direction have the same value Lx.

Thirdly, the pads 3 to 6 are laid out in such a way that the offset from the center 13 of the pad 3 to the center 14 of the pad 4 in the y direction, the offset from the center 14 of the pad 4 to the center 15 of the pad 5 in the y direction, and the offset from the center 15 of the pad 5 to the center 16 of the pad 6 in the y direction have the same value Ly.

This layout of the pads 3 to 6 makes it possible to set the distances which the distal ends of the probes in the x direction and the y direction even, thereby enhancing the uniformity of the contact pressure of the probes on the pads 3 to 6.

In the embodiment, the layouts and shapes of the pads 3 to 6 and the leads 7 to 10 are designed as given later in order to reduce the area of the region needed for the layout of the pads 3 to 6 while meeting the above conditions.

The center 14 of the pad 4 is positioned apart from the center 13 of the pad 3 by Ly in the −y direction (downward) and by Lx in the +x direction (rightward). The center 15 of the pad 5 is positioned apart from the center 14 of the pad 4 by Ly in the −y direction and by Lx in the +x direction. The center 16 of the pad 6 is positioned apart from the center 15 of the pad 5 by Ly in the −y direction and by Lx in the +x direction. Accordingly, the centers 13, 14, 15 and 16 are laid out in a line in the named order at equidistances. The area of the pad 4 is smaller than that of the pad 3, the area of the pad 5 is smaller than that of the pad 4, and the area of the pad 6 is smaller than that of the pad 5.

The shape of the pad 3, which is provided at the topmost stage, is substantially rectangular.

The shape of the pad 4, which is provided at the second stage, is a rectangle whose lower left corner, one of the two lower corners, is cut off. Accordingly, the pad 4 has a slanted side 4a formed at the lower left corner.

The shape of the pad 5, which is provided at the third stage, is a rectangle from which the corner facing the cut-off corner of the pad 4 and the corner diagonal to the former corner (i.e., the upper right corner and lower left corner) are cut off. Accordingly, the pad 5 has a slanted side 5a formed at the upper right corner and a slanted side 5b formed at the lower left corner. The direction in which the slanted side 5a at the upper right corner of the pad 5 extends is parallel to the direction in which the slanted side 4a at the lower left corner of the pad 4 extends, and the side 5a and the side 4a face each other.

The shape of the pad 6, which is provided at the fourth stage (bottommost stage), is a rectangle from which the corner facing the cut-off corner of the pad 5 and the two lower corners (i.e., the upper right corner, the lower left corner and the lower right corner) are cut off. Accordingly, the pad 6 has a slanted side 6a formed at the upper right corner, a slanted side 6b formed at the lower left corner and a slanted side 6c formed at the lower right corner. The direction in which the slanted side 6a at the upper right corner of the pad 6 extends is parallel to the direction in which the slanted side 5a at the lower left corner of the pad 5 extends, and the side 6a and the side 5b face each other.

The leads 7 are connected to the bottom sides of the pads 3 and extend in the −y direction along the left sides of the pads 4 from the bottom sides of the pads 3, and reaches near the pads 5. The leads 7 run between the side 4a of the pad 4 and the side 5a of the pad 5 in parallel to the sides 4a and 5a and reach the positions between pads 5, passing through both sides 4a and 5a. That is, the lead 7 has a slanted portion 7a positioned between the side 4a and the side 5a and parallel to the sides 4a and 5a. The lead 7 extends from the end of the slanted portion 7a in the −y direction along the left side of the pad 5.

The leads 8 are connected to the bottom sides of the pads 4 and extend in the y direction along the leads 7 from the bottom sides of the pads 4. The leads 7 and 8 both run in the −y direction and reach near the pads 6. The leads 7 and 8 run between the side 5b of the pad 5 and the side 6a of the pad 6 in parallel to the sides 5b and 6a and reach the positions between pads 6, passing through both sides 5b and 6a. That is, the leads 7 and 8 respectively have portions 7b and 8a positioned between the sides 5b and 6a and parallel to those sides. The leads 7 and 8 extend from the ends of the slanted portions 7b and 8a in the −y direction along the left side of the pad 6.

The leads 9 are connected to the pads 5 and extend in the −y direction along the leads 7 and 8 from the bottom sides of the pads 5.

The leads 10 are connected to the pads 6 and extend in the −y direction from the bottom sides of the pads 6. The width of the lead 10 is thicker than the widths of those portions of the leads 7 to 9 which are laid out in a region excluding the region between the side 6b and the side 6c.

In the region between the sides 6b and 6c of the pad 6, the lead 7 runs in parallel to the side 6c and the lead 9 runs in parallel to the side 6b. Accordingly, the leads 7 to 10 are laid out at equidistances in the region between the sides 6b and 6c of the pad 6. The widths of those portions of the leads 7 to 9 which are laid out in the region are thicker than the widths of the other portions and are approximately equal to the width of the lead 10.

According to the embodiment, as the layouts and the shapes of the pads 3 to 6 and the leads 7 to 10 are designed as described above, the region on the tape carrier 2 can be used effectively and the area needed for the layout of the pads 3 to 6 can be reduced.

First, as the leads 7 and 8 have the slanted portions 7a, 7b and 8a extending obliquely, the distance between the adjoining two pads 5 and the distance between the adjoining two pads 6 can be made shorter. The lead 7 extends obliquely lower rightward between the side 4a of the pad 4 and the side 5a of the pad 5. Accordingly, the pads 5 can be laid out rightward by the rightward-extended portion of the lead 7 between the sides 4a and 5a. This makes it possible to shorten the distances between the pads 5.

Likewise, the leads 7 and 8 extend obliquely lower rightward between the side 5b of the pad 5 and the side 6a of the pad 6. Accordingly, the pads 6 can be laid out rightward by the rightward-extended portions of the leads 7 and 8. This makes it possible to shorten the distances between the pads 6. The narrower the pitches of the pads 5 and 6 is, the smaller the x-directional width of the region needed for the layout of the pads 3 to 6 becomes. As the leads 7 and 8 have the obliquely extending portions or the portion between the sides 4a and 5a and the portion between the sides 5b and 6a, therefore, the x-directional width of the region needed for the layout of the pads 3 to 6 can be made smaller effectively.

The corners of the pads 4 to 6 are cut off and the pads 4 to 6 and the leads 7 and 8 are laid out in such a way that the cut-off portions of the pads 4 to 6 face the obliquely extending portions of the leads 7 and 8. This can reduce the y-directional width of the region needed for the layout of the pads 3 to 6. As mentioned above, the lower left corner of the pad 4 and the upper right corner of the pad 5 are cut off and the cut-off portions face the obliquely extending portion of the lead 7. This layout of the pads 4 and 5 and the lead 7 can reduce the y-directional offset (distance) between the center 14 of the pad 4 and the center 15 of the pad 5 while keeping the necessary clearances between the pad 4 and the lead 7 and between the pad 5 and the lead 7.

Likewise, the lower left corner of the pad 5 and the upper right corner of the pad 6 are cut off and the cut-off portions face the obliquely extending portions of the leads 7 and 8. This layout of the pads 5 and 6 and the leads 7 and 8 can reduce the y-directional offset (distance) between the center 15 of the pad 5 and the center 16 of the pad 6. Reducing the y-directional offset between the center 14 of the pad 4 and the center 15 of the pad 5 and the y-directional offset between the center 15 of the pad 5 and the center 16 of the pad 6 means a reduction in the y-directional width of the region needed for the layout of the pads 3 to 6.

To make the y-directional width of the region needed for the layout of the pads 3 to 6 smaller, it is preferable that the direction in which the slanted sides at the cut-off corners of the pads 4 to 6 extend should be parallel to the obliquely extending portions of the leads 7 and 8. In other words, it is preferable that the extending direction of the side 4a at the lower left corner of the pad 4 and the extending direction of the side 5a at the upper right corner of the pad 5 should be parallel to the extending direction of the slanted portion 7a of the lead 7, and the extending direction of the side 5b at the lower left corner of the pad 5 extends and the extending direction of the side 6a at the upper right corner of the pad 6 should be parallel to the extending direction of the slanted portions 7b and 8a of the leads 7 and 8.

Further, the skew cut-off of the lower right corners of the pads 6 is effective in making the y-directional width of the region needed for the layout of the leads 7 to 10 smaller so that the leads 7 to 10 are laid out at equidistances in the region closer to the semiconductor chip 1 than the bottom sides of the pads 6.

According to the embodiment, as apparent from the above, the area of the region needed for the layout of the pads 3 to 6 of the COF package can be made smaller effectively by optimizing the shapes of the pads 3 to 6 and the leads 7 to 10.

The embodiment can be modified in various forms within the scope and spirit of the invention. For example, the number of layout stages of pads can be other than four in the embodiment. When three stages of pads are laid out, the pads 5 at the third stage are not provided and the pads 6 whose upper right corners, lower left corners and lower right corners are cut off are laid out under the second stage of pads 4. When pads are laid out in N stages where N is equal to or greater than five, the pads 5 whose upper right corners and lower left corners are cut off are laid out in (N–3) stages under the second stage of pads 4. And the pads 6 whose upper right corners, lower left corners and lower right corners are cut off are laid out under the rows of pad 5.

Figure 4:
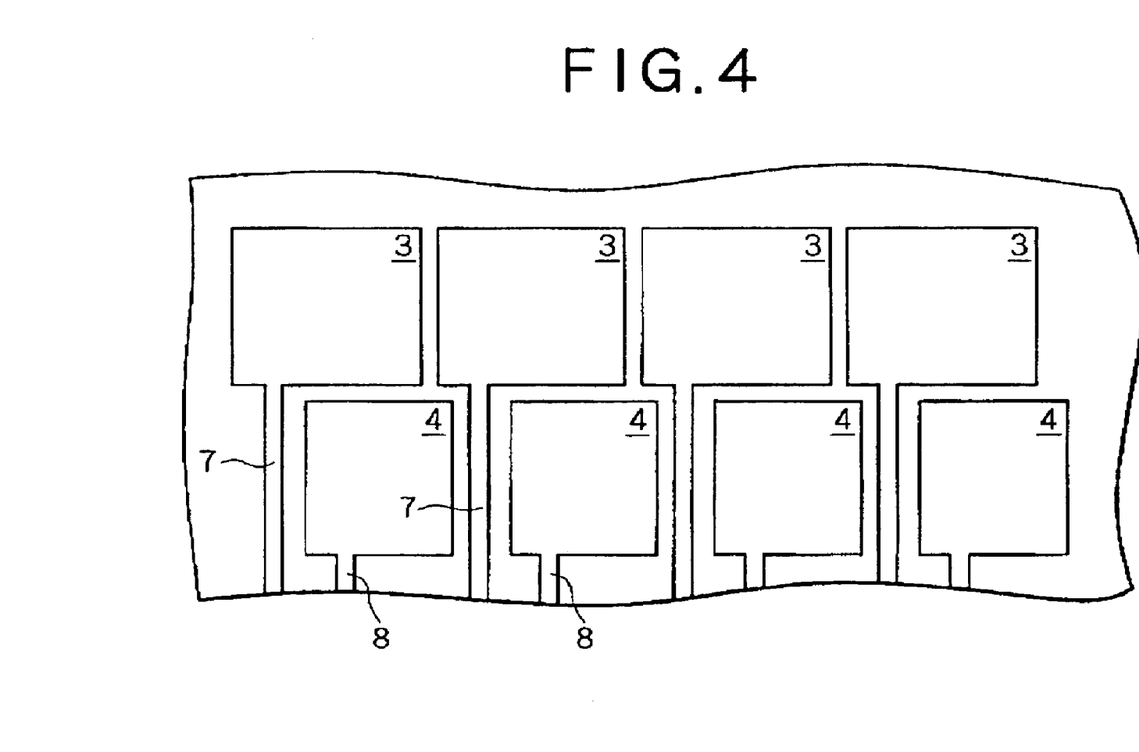
FIG. 4 is a plan view showing a comparative example in which there are two stages of pads.

It is to be noted however that setting the number of stages of pads equal to one or two takes away the effect of reducing the y-directional width of the region needed for the layout of the pads and makes the invention insignificant. FIG. 4 is a plan view showing a comparative example in which there are two stages of pad. As shown in FIG. 4, because of the presence of the leads 7 and 8, the structure that only has the topmost stage of pads 3 and the second stage of pads 4 does not bring about a situation where the y-directional offset between the pad 3 and the pad 4 becomes large. Therefore, it is insignificant to cut off the corners of the pads askew. In this respect, the layout of the pads and leads in the present invention is adapted to a semiconductor device whose pads are arranged in three or more stages.

In the embodiment, the shapes of the pads 3 to 6 and the leads 7 to 10 may be inverted left side right.

Figure 5:
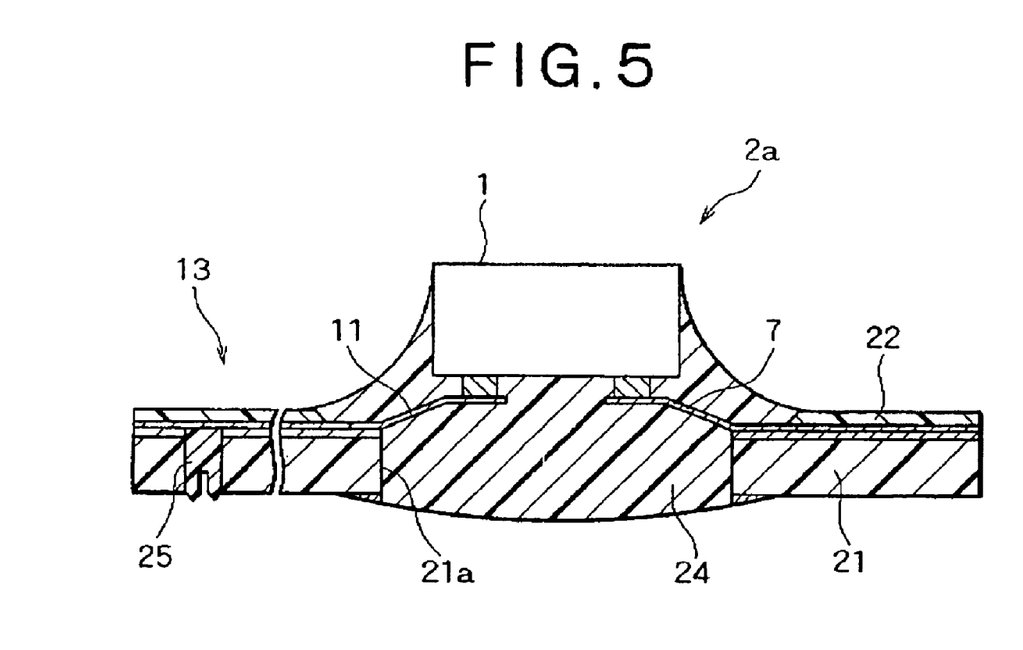
FIG. 5 is a cross-sectional view showing an integrated circuit device according to a modification of the first embodiment.

Next, a modification of the first embodiment is discussed. FIG. 5 is a cross-sectional view showing an integrated circuit device according to the modification. While the semiconductor chip 1 is mounted on the COF package in the first embodiment, the semiconductor chip 1 can be mounted on another type of package or a TCP like TAB in the invention. As shown in FIG. 5, the semiconductor chip 1 is mounted on a TAB according to the modification. In the modification, a device hole 21a is provided in the base film 21. Each of the leads 7 to 11 has a projection protruding inward of the device hole 21a from the edge of the device hole 21a. The semiconductor chip 1 is connected to the projections of the leads 7 to 11 via bumps 23. The junctions between the semiconductor chip 1 and the leads 7 to 11 and the interior of the device hole 21a are sealed and protected with the seal resin 24. Further, the cut line 13 is provided with a flex resin portion 25. The other structure and advantages of the modification are the same as those of the first embodiment.

Figure 6:
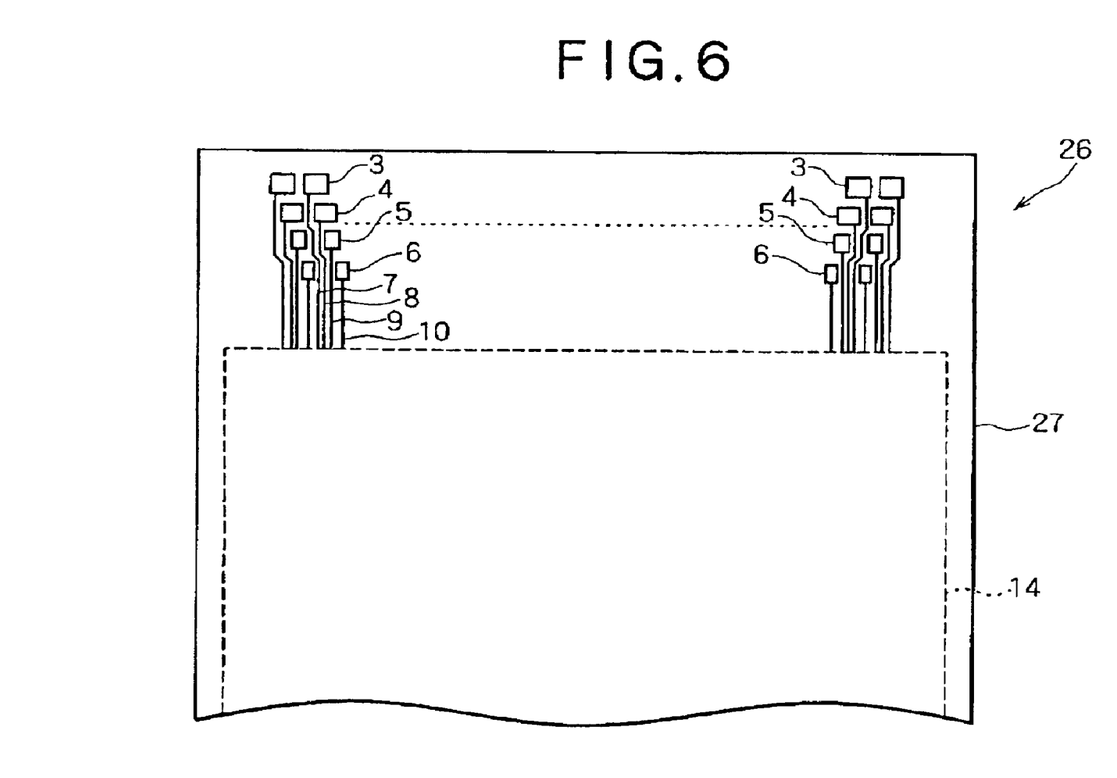
FIG. 6 is a plan view showing an integrated circuit device according to a second embodiment of the invention.

The second embodiment of the present invention is described below. FIG. 6 is a plan view showing an integrated circuit device according to the second embodiment. As shown in FIG. 6, the integrated circuit device according to the embodiment is a semiconductor chip 26. The embodiment attempts to reduce the area of the pad-layout region provided at the semiconductor chip 26 where an integrated circuit 14 is formed.

The semiconductor chip 26 is provided with a semiconductor substrate 27 made of, for example, silicon. The integrated circuit 14 is formed at the surface of the semiconductor substrate 27. The pads 3 to 6 and the leads 7 to 10 are provided at the surface of the semiconductor substrate 27 in such a way as to connect to the integrated circuit 14. The pads 3 to 6 supply signals, externally input, to the integrated circuit 14 and send out signals, output from the integrated circuit 14, both via the leads 7 to 10. The layouts and shapes of the pads 3 to 6 and the leads 7 to 10 are the same as those of the first embodiment. The embodiment can reduce the pad-layout region provided at the semiconductor chip due to the same reason as applied to the first embodiment.

Figure 7:
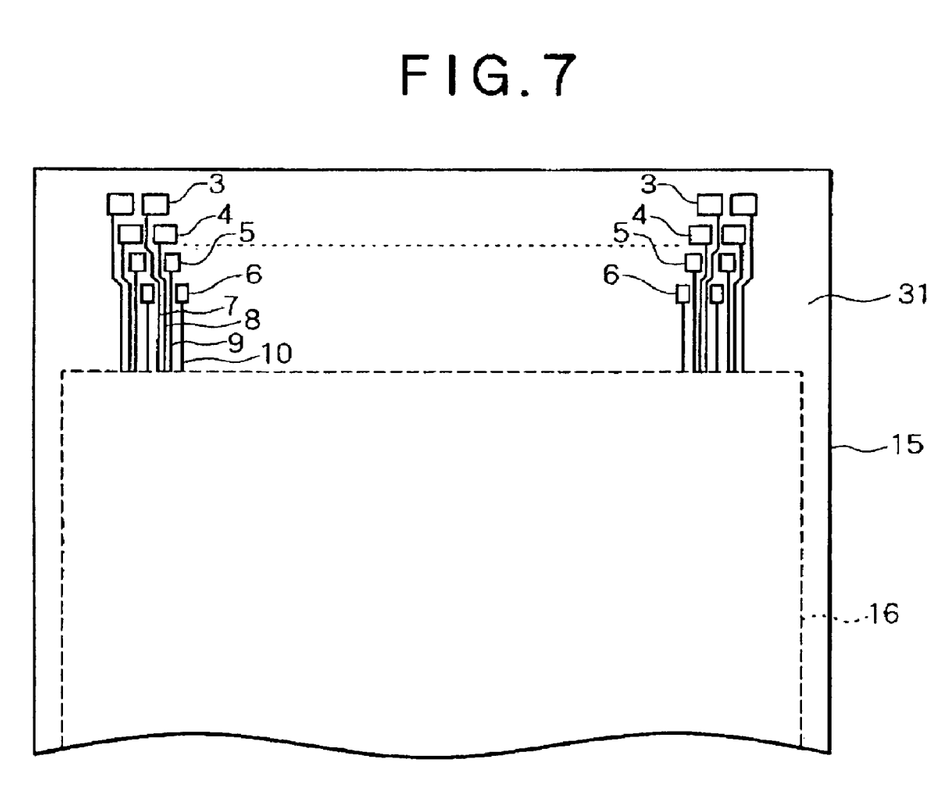
FIG. 7 is a plan view showing an integrated circuit device according to a third embodiment of the invention.

The third embodiment of the present invention is described below. FIG. 7 is a plan view showing an integrated circuit device according to the third embodiment. As shown in FIG. 7, the integrated circuit device according to the embodiment is an electronic device. The electronic device according to the embodiment is provided with a printed wiring board (PCB) 31. An electronic circuit 16 is provided at the surface of the printed wiring board 31. The embodiment attempts to reduce the area of the pad-layout region provided at the printed wiring board 31.

The printed wiring board 31 is provided with an insulating substrate 15 which is formed of, for example, a resin. The electronic circuit 16 is provided on the insulating substrate 15. The electronic circuit 16 is, for example, the same circuit as the one located inside the cut line 13 shown in FIG. 1. That is, the electronic circuit 16 is the circuit on which the leads 7 to 10 are formed and the semiconductor chip 1 (see FIG. 1) is mounted in such a way as to connect to the leads 7 to 10.

The pads 3 to 6 and the leads 7 to 10 are formed in the region that adjoins the electronic circuit 16 on the insulating substrate 15 by, for example, a printing technology. The pads 3 to 6 are respectively connected to the leads 7 to 10 which are connected to the electronic circuit 16. The pads 3 to 6 supply signals, externally input, to the electronic circuit 16 and send out signals, output from the electronic circuit 16, both via the leads 7 to 10. The layouts and shapes of the pads 3 to 6 and the leads 7 to 10 are the same as those of the first embodiment. The embodiment can reduce the region needed for the layout of pads provided at the PCB due to the same reason as applied to the first embodiment.

The electronic circuit 16 may be separated from the insulating substrate 15 after being tested using the pads 3 to 6 and the leads 7 to 10, or may be mounted together with the insulating substrate 15 in a package without being separated from the insulating substrate 15. The structure of the electronic circuit 16 is not limited to the structure of the one located inside the cut line 13 shown in FIG. 1. The invention can be adapted to every electronic circuit.

A tape carrier package which has a semiconductor chip mounted on a tape carrier is described in the foregoing description of the first embodiment, a semiconductor chip having an integrated circuit formed on a semiconductor substrate is described in the foregoing description of the second embodiment, and an electronic device having an electronic circuit provided on a printed wiring board is described in the foregoing description of the third embodiment. However, the present invention is in no way limited to those embodiments, but can be adapted to any device as long as the device is an integrated circuit device that has an integrated circuit and pads and leads which input and output signals to and from the integrated circuit.

What is claimed is:

1. An integrated circuit device comprising:
    a substrate;
    a first pad row having a plurality of first pads provided in a first direction on said substrate;
    a second pad row having a plurality of second pads provided in said first direction on said substrate;
    a third pad row having a plurality of third pads provided in said first direction on said substrate, said first to third pad rows being apart from each other in a second direction orthogonal to said first direction, and said second pad row being sandwiched by said first and third pad rows;
    a plurality of first leads provided on said substrate and respectively connected to said plurality of first pads;
    a plurality of second leads provided on said substrate and respectively connected to said plurality of second pads;
    a plurality of third leads provided on said substrate and respectively connected to said plurality of third pads; and
    an integrated circuit provided at that position on said substrate at which said integrated circuit and said second pad row sandwich said third pad row, and connected to said first leads, said second leads and said third leads,
    wherein a first slanted side extending in a direction oblique to said first direction is formed at each of said second pads at that corner which lies on that side of said third pad row, a second slanted side extending in a direction oblique to said second direction is formed at each of said third pads at that corner which faces said first slanted side, and each of said first leads has a first slanted portion provided between said first slanted side and said second slanted side and extending in a direction oblique to said first direction.

2. The integrated circuit device according to claim 1, wherein the direction in which said first slanted side extends, the direction in which said second slanted side extends and the direction in which said first slanted portion extends are parallel to one another.

3. The integrated circuit device according to claim 1, wherein said plurality of first pads are laid out at equidistances, said plurality of second pads are laid out at equidistances, said plurality of third pads are laid out at equidistances, a layout pitch of said first pads, a layout pitch of said second pads and a layout pitch of said third pads are equal to one another, an offset in said first direction from a center of said first pad to a center of said second pad is equal to an offset in said first direction from a center of said second pad to a center of said third pad, and an offset in said second direction from a center of said first pad to a center of said second pad is equal to an offset in said second direction from a center of said second pad to a center of said third pad.

4. The integrated circuit device according to claim 1 being a tape carrier package, wherein said substrate is a base film of said tape carrier, said integrated circuit is a semiconductor chip mounted on said tape carrier.

5. The integrated circuit device according to claim 1 being a semiconductor chip, wherein said substrate is a semiconductor substrate of said semiconductor chip, said integrated circuit is an integrated circuit formed at a surface of said semiconductor substrate.

6. The integrated circuit device according to claim 1 being an electronic device, wherein said substrate is an insulating substrate of a printed wiring board, said integrated circuit is an electronic circuit provided on said insulating substrate.

7. The integrated circuit device according to claim 1, further comprising:
    a fourth pad row having a plurality of fourth pads provided in said first direction on said substrate, said third pad row being sandwiched by said second and fourth pad rows; and
    a plurality of fourth leads provided on said substrate and respectively connected between said plurality of fourth pads and said integrated circuit, and
    wherein a third slanted side inclined to said first direction is formed at each of said third pads at a diagonal portion to said second slanted side, a fourth slanted side inclined to said first direction is formed at each of said fourth pads at that corner which faces said third slanted side, each of said first leads has a second slanted portion provided between said third slanted side and said fourth slanted side and extending in a direction inclined to said first direction, and each of said second leads has a third slanted portion provided between said third slanted side and said fourth slanted side and extending in a direction inclined to said first direction.

8. The integrated circuit device according to claim 7, wherein the direction in which said third slanted side extends, the direction in which said fourth slanted side extends, the direction in which said second slanted portion extends and the direction in which said third slanted portion extends are parallel to one another.

9. The integrated circuit device according to claim 7, wherein a plurality of said third pad rows are provided between said second pad row and said fourth pad row.

10. A wiring board comprising:
    a substrate;
    a first pad row having a plurality of first pads provided in a first direction on said substrate;
    a second pad row having a plurality of second pads provided in said first direction on said substrate;
    a third pad row having a plurality of third pads provided in said first direction on said substrate, said first to third pad rows being apart from each other in a second direction orthogonal to said first direction, and said second pad row being sandwiched by said first and third pad rows;

a plurality of first leads provided on said substrate and respectively connected to said plurality of first pads;

a plurality of second leads provided on said substrate and respectively connected to said plurality of second pads; and a plurality of third leads provided on said substrate and respectively connected to said plurality of third pads, whereby a first slanted side extending in a direction oblique to said first direction is formed at each of said second pads at that corner which lies on that side of said third pad row, a second slanted side extending in a direction oblique to said second direction is formed at each of said third pads at that corner which faces said first slanted side, and each of said first leads has a first slanted portion provided between said first slanted side and said second slanted side and extending in a direction oblique to said first direction.

11. The wiring board according to claim 10, wherein the direction in which said first slanted side extends, the direction in which said second slanted side extends and the direction in which said first slanted portion extends are parallel to one another.

12. The wiring board according to claim 10, wherein said plurality of first pads are laid out at equidistances, said plurality of second pads are laid out at equidistances, said plurality of third pads are laid out at equidistances, a layout pitch of said first pads, a layout pitch of said second pads and a layout pitch of said third pads are equal to one another, an offset in said first direction from a center of said first pad to a center of said second pad is equal to an offset in said first direction from a center of said second pad to a center of said third pad, and an offset in said second direction from a center of said first pad to a center of said second pad is equal to an offset in said second direction from a center of said second pad to a center of said third pad.

13. The wiring board according to claim 10 being a tape carrier, wherein said substrate is a base film of said tape carrier.

14. The wiring board according to claim 10, wherein said substrate is a semiconductor substrate.

15. The wiring board according to claim 10 being a printed wiring board, wherein said substrate is an insulating substrate of said printed wiring board.

16. The wiring board according to claim 10, further comprising:

a fourth pad row having a plurality of fourth pads provided in said first direction on said substrate, said third pad row being sandwiched by said second and fourth pad rows; and a plurality of fourth leads provided on said substrate and respectively connected between said plurality of fourth pads and said integrated circuit, and wherein a third slanted side inclined to said first direction is formed at each of said third pads at a diagonal portion to said second slanted side, a fourth slanted side inclined to said first direction is formed at each of said fourth pads at that corner which faces said third slanted side, each of said first leads has a second slanted portion provided between said third slanted side and said fourth slanted side and extending in a direction inclined to said first direction, and each of said second leads has a third slanted portion provided between said third slanted side and said fourth slanted side and extending in a direction inclined to said first direction.

17. The wiring board according to claim 16, wherein the direction in which said third slanted side extends, the direction in which said fourth slanted side extends, the direction in which said second slanted portion extends and the direction in which said third slanted portion extends are parallel to one another.

18. The wiring board according to claim 16, wherein a plurality of said third pad rows are provided between said second pad row and said fourth pad row.

* * * * *